(12) United States Patent
Hikosaka et al.

(10) Patent No.: US 8,093,083 B1
(45) Date of Patent: Jan. 10, 2012

(54) METHOD FOR MANUFACTURING A SEMICONDUCTOR LIGHT EMITTING DEVICE

(75) Inventors: Toshiki Hikosaka, Kanagawa-ken (JP);
Tomonari Shioda, Kanagawa-ken (JP);
Yoshiyuki Harada, Tokyo (JP);
Naoharu Sugiyama, Kanagawa-ken (JP); Koichi Tachibana, Kanagawa-ken (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/029,416

(22) Filed: Feb. 17, 2011

(30) Foreign Application Priority Data

Aug. 4, 2010 (JP) ................. 2010-175803

(51) Int. Cl.
*H01L 21/00* (2006.01)
*H01L 33/00* (2006.01)
(52) U.S. Cl. .............. 438/46; 257/103; 257/E33.025
(58) Field of Classification Search .............. None
See application file for complete search history.

(56) References Cited

U.S. PATENT DOCUMENTS

| | | | | |
|---|---|---|---|---|
| 5,358,897 A * | 10/1994 | Valster et al. | ...... | 117/89 |
| 5,814,533 A * | 9/1998 | Shakuda | ...... | 438/46 |
| 7,973,322 B2 * | 7/2011 | Akita et al. | ...... | 257/79 |
| 2001/0009279 A1 * | 7/2001 | Kikkawa | ...... | 257/24 |
| 2003/0203629 A1 * | 10/2003 | Ishibashi et al. | ...... | 438/689 |
| 2010/0220761 A1 * | 9/2010 | Enya et al. | ...... | 372/45.01 |
| 2011/0010843 A1 * | 1/2011 | Galati et al. | ...... | 4/622 |

FOREIGN PATENT DOCUMENTS

JP  2751987  2/1998

OTHER PUBLICATIONS

U.S. Appl. No. 12/874,594, filed Sep. 2, 2010, Tomonari Shioda, et al.
U.S. Appl. No. 12/875,503, filed Sep. 3, 2010, Toshiki Hikosaka, et al.
U.S. Appl. No. 13/035,304, filed Feb. 25, 2011, Harada, et al.

* cited by examiner

*Primary Examiner* — Alonzo Chambliss
(74) *Attorney, Agent, or Firm* — Oblon, Spivak, McClelland, Maier & Neustadt, L.L.P.

(57) ABSTRACT

In one embodiment, a method is disclosed for manufacturing a semiconductor light emitting device. The device includes a crystal layer including a nitride semiconductor. The crystal layer contains In and Ga atoms. The method can include forming the crystal layer by supplying a source gas including a first molecule including Ga atoms and a second molecule including In atoms onto a base body. The crystal layer has a ratio xs of a number of the In atoms to a total of the In atoms and the Ga atoms being not less than 0.2 and not more than 0.4. A vapor phase supply ratio xv of In is a ratio of a second partial pressure to a total of first and second partial pressures. The first and second partial pressures are pressure of the first and second molecules and degradation species of the first and second molecules on the source gas, respectively. $(1-1/xv)/(1-1/xs)$ is less than 0.1.

20 Claims, 5 Drawing Sheets

US 8,093,083 B1

METHOD FOR MANUFACTURING A SEMICONDUCTOR LIGHT EMITTING DEVICE

CROSS-REFERENCE TO RELATED APPLICATIONS

This application is based upon and claims the benefit of priority from the prior Japanese Patent Application No. 2010-175803, filed on Aug. 4, 2010; the entire contents of which are incorporated herein by reference.

FIELD

Embodiments described herein relate generally to a method for manufacturing a semiconductor light emitting device.

BACKGROUND

Well layers formed from, for example, InGaN are used as active layers in light emitting devices using nitride semiconductors.

When forming well layers, it is important to form high-quality crystals while ensuring that a necessary amount of In is incorporated. If a crystal growth temperature of the well layers is lowered in order to promote the incorporation of the indium (In), thermal stability of the active layer with respect to high temperature processing conducted subsequently will be degraded. A method of controlling the growth temperature and the growth rate when forming the InGaN layers has been proposed. However, there is still room for improvement in the forming of high-quality crystals.

DETAILED DESCRIPTION

Figure 1:
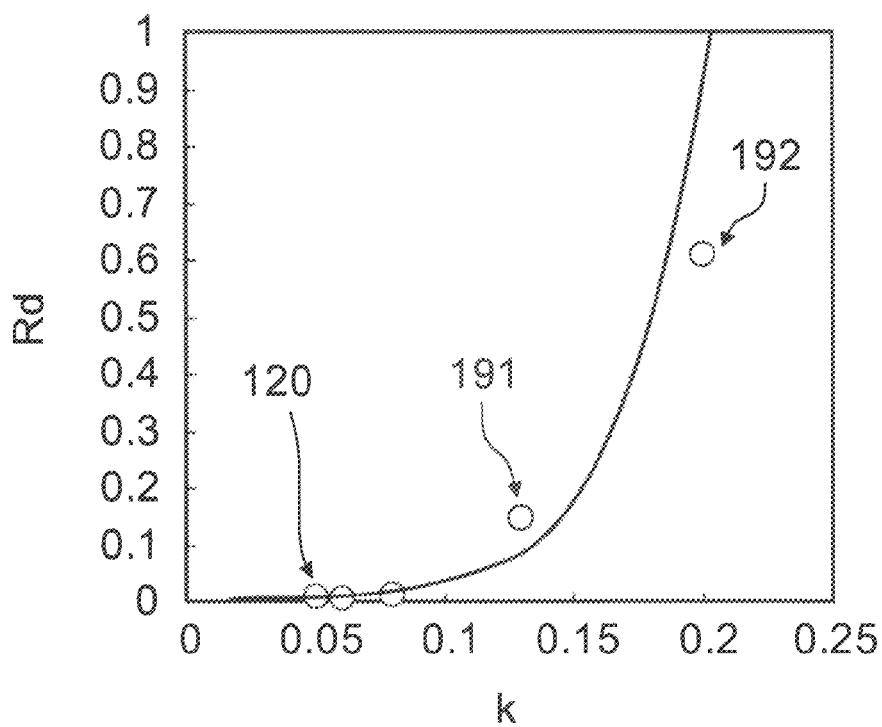
FIG. 1 is a graph illustrating the characteristics of semiconductor light emitting devices.

In general, according to one embodiment, a method is disclosed for manufacturing a semiconductor light emitting device. The semiconductor light emitting device includes a crystal layer including a nitride semiconductor. The crystal layer contains In atoms and Ga atoms. The method can include forming the crystal layer by supplying a source gas including a first molecule including Ga atoms and a second molecule including In atoms onto a major surface of a base body. The crystal layer has a ratio xs of a number of the In atoms to a total of the number of the In atoms and a number of the Ga atoms being not less than 0.2 and not more than 0.4. A vapor phase supply ratio xv of In is a ratio of a second partial pressure to a total of a first partial pressure and the second partial pressure. The first partial pressure is a pressure of the first molecule and a degradation species of the first molecule on the source gas. The second partial pressure is a pressure of the second molecule and a degradation species of the second source molecule on the source gas. $(1-1/xv)/(1-1/xs)$ is less than 0.1.

Various embodiments will be described hereinafter with reference to the accompanying drawings.

Note that the drawings are schematic or simplified illustrations and that relationships between thicknesses and widths of parts and proportions in size between parts may differ from actual parts. Also, even where identical parts are depicted, mutual dimensions and proportions may be illustrated differently depending on the drawing.

Note that in the drawings and specification of this application, the same numerals are applied to elements that have already appeared in the drawings and been described, and repetitious detailed descriptions of such elements are omitted.

Embodiment

Figure 2:
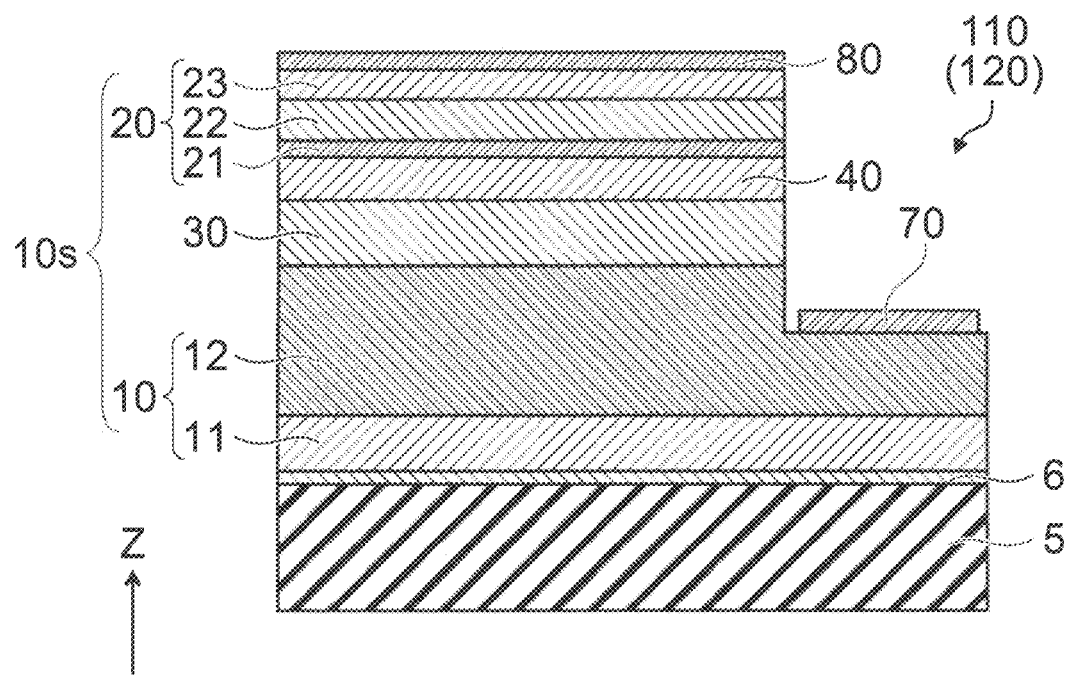
FIG. 2 is a schematic cross-sectional view illustrating the configuration of an entirety of a semiconductor light emitting device according to an embodiment.
Figure 3:
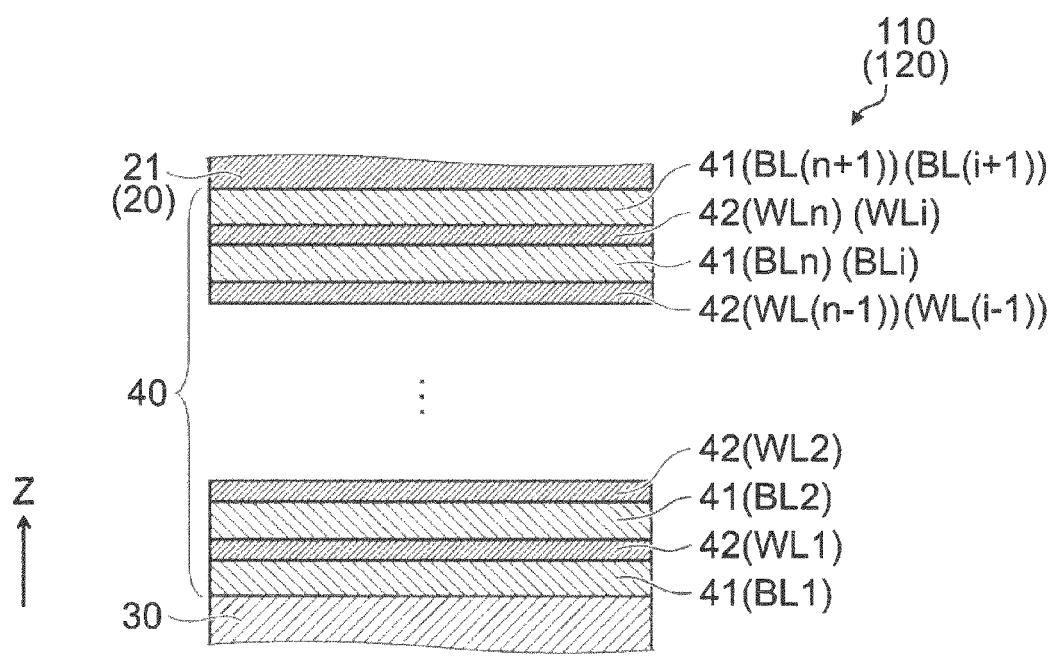
FIG. 3 is a schematic cross-sectional view illustrating a semiconductor light emitting device according to the embodiment.

FIG. 2 and FIG. 3 are schematic cross-sectional views illustrating the configuration of a semiconductor light emitting device according to an embodiment.

First, an overview of the semiconductor light emitting device formed by the method for manufacturing a semiconductor light emitting device according to the embodiment will be described referring to FIGS. 2 and 3.

As illustrated in FIG. 2, a semiconductor light emitting device 110 according to the embodiment includes a first semiconductor layer 10, a second semiconductor layer 20, and an active layer 40 provided between the first semiconductor layer 10 and the second semiconductor layer 20.

The first semiconductor layer 10 and the second semiconductor layer 20 include nitride semiconductors.

For example, the first semiconductor layer 10 is an n-type and the second semiconductor layer 20 is a p-type. However, the embodiment is not limited to thereto and the first semiconductor layer 10 may be the p-type and the second semiconductor layer 20 may be the n-type. Hereafter, a case in which the first semiconductor layer 10 is the n-type, and the second semiconductor layer 20 is the p-type will be described.

Here, a direction from the first semiconductor layer 10 toward the second semiconductor layer 20 is defined as a Z-axis direction (stacking direction).

As illustrated in FIG. 2, in this specific example, a multilayered structural body 30 is provided between the first semiconductor layer 10 and the active layer 40. The multilayered structural body 30 is, for example, a superlattice layer. The multilayered structural body 30 is, for example the n-type. The multilayered structural body 30 may be provided or omitted as necessary. The multilayered structural body 30 may also be considered to be included in the first semiconductor layer 10.

The semiconductor light emitting device 110 may further include a substrate 5 provided on a side of the first semiconductor layer 10 opposite to the second semiconductor layer 20. A sapphire substrate, for example, is used for the substrate 5. The semiconductor light emitting device 110 may further include a buffer layer 6 provided between the substrate 5 and the first semiconductor layer 10. The buffer layer 6 is formed on the substrate 5, and a stacked structural body 10s including the first semiconductor layer 10, the multilayered structural body 30, the active layer 40, and the second semiconductor layer 20 is formed on the buffer layer 6. After the stacked structural body 10s is formed, the substrate 5 and (at least a part of) the buffer layer 6 may be removed. Thus, in the semiconductor light emitting device 110, the substrate 5 and the buffer layer 6 may be provided or omitted as necessary.

In this example, the first semiconductor layer 10 includes an n-side base layer 11 and an n-side contact layer 12 provided between the n-side base layer 11 and the active layer 40 (in this example, the multilayered structural body 30).

The multilayered structural body 30 is provided on the n-side contact layer 12. The multilayered structural body 30 includes a plurality of first layers (not shown) stacked in the Z-axis direction and a second layer provided between each of the first layers. In other words, the multilayered structural body 30 includes a plurality of first layers and a plurality of second layers alternately stacked in the Z-axis direction.

Here, in this specification, the term "stacked" includes cases where constituents are stacked so that they are in contact with each other and also cases where constituents are stacked by inserting other layers therebetween. The first layers include, for example, GaN, and the second layers include, for example, InGaN.

In this example, the second semiconductor layer 20 includes a first p-side layer 21, a second p-side layer 22, and a p-side contact layer 23. The first p-side layer 21 is provided between the p-side contact layer 23 and the active layer 40. The second p-side layer 22 is provided between the p-side contact layer 23 and the first p-side layer 21. A p-type AlGaN layer, for example, is used for the first p-side layer 21. A p-type GaN layer, for example, is used for the second p-side layer 22. A p-type GaN layer, for example, is used for the p-side contact layer 23.

Moreover, in the stacked structural body 10s including the first semiconductor layer 10, the multilayered structural body 30, the active layer 40, and the second semiconductor layer 20, a portion of the n-side contact layer 12, that is the first semiconductor layer 10, and the multilayered structural body 30, the active layer 40, and the second semiconductor layer 20 that correspond to the portion are removed. A first electrode 70 is provided in contact with the first semiconductor layer 10 and a second electrode 80 is provided in contact with the second semiconductor layer 20 on a first major surface side of a second semiconductor layer 20 side of the stacked structural body 10s.

As illustrated in FIG. 3, the active layer 40 includes a plurality of barrier layers 41 and a well layer 42 provided between each of the plurality of barrier layers 41. For example, the active layer 40 may have a single quantum well (SQW) structure including two of the barrier layers 41 and the well layer 42 provided between the barrier layers 41. For example, the active layer 40 may have a multi quantum well (MQW) structure including three of more of the barrier layers 41 and the well layer 42 provided between each of the barrier layers 41.

In the example illustrated in FIG. 3, the active layer 40 includes (n+1) of the barrier layers 41 and n of the well layers 42 (n is an integer greater than or equal to 1). An (i+1)th barrier layer BL(i+1) is disposed farther to the second semiconductor layer 20 side than an ith barrier layer BLi. An ith well layer WLi is disposed farther to the second semiconductor layer 20 side than an (i−1)th well layer WL(i−1). A first barrier layer BL1 is provided between the first semiconductor layer 10 and a first well layer WL1 (in the example illustrated in FIG. 3, between the multilayered structural body 30 and the first well layer WL1). An nth well layer WLn is provided between an nth barrier layer and an (n+1)th barrier layer BL(n+1). The (n+1)th barrier layer BL(n+1) is provided between the nth well layer WLn and the second semiconductor layer 20.

The well layer 42 includes a nitride semiconductor including a group III element and a group V element.

The well layer 42 includes a nitride semiconductor including indium (In) and gallium (Ga).

Specifically, the well layer 42 includes $In_{xs}Ga_{1-xs}N$ ($0.2 \leq xs \leq 0.4$). Specifically, an In composition ratio xs is greater than 0.2 and less than or equal to 0.4. A peak wavelength of light exiting from the semiconductor light emitting device 110 in this case is approximately not less than 480 nm not more than 700 nm. Specifically, when the In composition ratio xs is 0.2, the peak wavelength of the emitted light is approximately 480 nm, and when the In composition ratio xs is 0.4, the peak wavelength of the light is approximately 700 nm.

Here, the In composition ratio xs of the well layer 42 of the semiconductor light emitting device 110 is a ratio of a number of the In atoms to a total of a number of the In atoms and a number of the Ga atoms included in the well layer 42.

The barrier layers 41 include nitride semiconductors including a group III element and a group V element. A band gap energy of the barrier layers 41 is greater than a band gap energy of the well layer 42.

If the barrier layers 41 include indium, a composition ratio of the indium among group III elements of the barrier layers 41 is lower than a composition ratio (the In composition ratio xs described above) of indium among group III elements of the well layer 42. Thereby, the band gap energy of the well layer 42 becomes less than the band gap energy of the barrier layers 41.

An example of a manufacturing method of the semiconductor light emitting device 110 will be described.

First, after the buffer layer 6 is formed, a crystal of the n-side base layer 11 is formed on a major surface of the substrate 5 made of sapphire or the like. For example, metal organic chemical vapor deposition (MOCVD) is used to form the crystals. Aside from this, molecular beam epitaxy (MBE) may also be used to form the crystals.

A GaN layer is used for the n-side base layer 11. A thickness of the n-side base layer 11 is, for example, 2 µm (micrometers). Additionally, the n-side base layer 11 may be doped with n-type impurities.

Aside from sapphire, various materials such as GaN, SiC, Si, GaAs, and the like may be used for the substrate 5.

Next, a crystal of the n-side contact layer 12 is formed on the n-side base layer 11. An n-type GaN layer is used for the n-side contact layer 12. Si is used as the n-type impurity that the n-side contact layer 12 is doped with. However, it is possible to use various elements besides Si such as Ge, Te, Sn, and the like.

An amount of the Si that the n-side contact layer 12 is doped with is, for example, about $2 \times 10^{18}$ cm$^{-3}$. A thickness of the n-side contact layer 12 is, for example, 4 µm.

Formation temperatures for both the n-side base layer 11 and the n-side contact layer 12 in the forming are not less than 1000° C. and not more than 1200° C.

Instead of a GaN layer, $In_{0.01}Ga_{0.99}N$ having a thickness of about 4 µm may be used as the n-side contact layer 12. A formation temperature when using the $In_{0.01}Ga_{0.99}N$ is not less than 700° C. and not more than 900° C.

Next, the multilayered structural body 30 is formed on the n-side contact layer 12. For example, an undoped $In_{0.05}Ga_{0.95}N$ layer (the second layer) and an undoped GaN layer (the first layer) are alternately formed as the multilayered structural body 30. A film thickness of the second layer is, for example, 1 nm, and a film thickness of the first layer is, for example, 2 nm. A number of the first layers is, for example, 21, and a number of the second layers is, for example, 20. Formation temperatures for the first layers and the second layers are not less than 700° C. and not more than 900° C. The multilayered structural body 30 may, for example, include n-type impurities such as Si and the like.

Next, the active layer 40 (specifically, the barrier layers 41 and the well layer 42) is formed on the multilayered structural body 30.

First, the first barrier layer 41 (the barrier layer BL1) is formed. Undoped GaN, for example, is used for the barrier layers 41. A thickness of the barrier layers 41 is, for example, 10 nm.

Thereafter, the first well layer 42 (the well layer WL1) is formed on the first barrier layer 41 (the barrier layer BL1). Undoped $In_{0.22}Ga_{0.78}N$, for example, is used for the well layer 42. A thickness of the well layer 42 is, for example, 2.5 nm.

Thereafter, in the same way, the barrier layers 41 and the well layers 42 are repeatedly formed while alternating. A total number of the barrier layers 41 is nine and a number of the well layers 42 is, for example, eight.

A formation temperature of the well layer 42 is, for example, not less than 600° C. and not more than 900° C. A formation temperature of the barrier layers 41 is the same as the temperature for the well layer 42, or is higher than the formation temperature of the well layer 42, for example, not less than 600° C. not more than 1000° C. Thus, by forming the barrier layers 41 at the formation temperature higher than the formation temperature of the well layer 42, generation of crystal defects in the active layer 40 can be reduced.

Hereinafter, a detailed description will be given regarding forming conditions of the active layer 40 including the well layer 42.

In this example, the barrier layers 41 and the well layer 42 are designed so that a photoluminescence (PL) wavelength of the active layer 40 at a room temperature is 530 nm.

The active layer 40 may include n-type impurities such as Si and the like or p-type impurities such as Mg and the like. Both the well layer 42 and the barrier layers 41 may be doped with the n-type or p-type impurities, or at least a portion of at least either of the well layer 42 and the barrier layers 41 may be doped.

Next, the first p-side layer 21 is formed on the active layer 40. P-type $Al_{0.2}Ga_{0.8}N$ doped with p-type impurities is used, for example, for the first p-side layer 21. A thickness of the first p-side layer 21 is, for example, approximately 10 nm. The first p-side layer 21 functions as an electron overflow preventing (suppressing) layer. Mg is used, for example, as the p-type impurity. A concentration of the Mg is, for example, approximately $1 \times 10^{19} cm^{-3}$. However, it is possible to use various elements such as Zn and C in addition to Mg. A formation temperature of the $Al_{0.2}Ga_{0.8}N$ that being to be the first p-side layer 21 is, for example, not less than 900° C. and not more than 1100° C.

Next, the second p-side layer 22 is formed on the first p-side layer 21. A p-type GaN layer doped with p-type impurities is used, for example, for the second p-side layer 22. A thickness of the second p-side layer 22 is, for example, approximately 100 nm. Mg is used, for example, as the p-type impurity. A concentration of the Mg is, for example, approximately $1 \times 10^{19} cm^{-3}$. However, it is possible to use various elements such as Zn and C in addition to Mg. A formation temperature of the p-type GaN being to be the second p-side layer 22 is, for example, not less than 900° C. and not more than 1100° C.

The p-side contact layer 23 is formed on the second p-side layer 22. A p-type GaN layer doped with p-type impurities is used, for example, for the p-side contact layer 23. A thickness of the first p-side contact layer 23 is, for example, approximately 10 nm. Mg is used, for example, as the p-type impurity. A concentration of the Mg is, for example, approximately $1 \times 10^{20} cm^{-3}$. However, it is possible to use various elements such as Zn and C in addition to Mg. A formation temperature of the p-type GaN layer being to be the p-side contact layer 23 is, for example, not less than 900° C. not more than 1100° C.

In this way, the formed stacked structural body 10s is subjected to the following device manufacturing process.

The second electrode 80 is formed on the p-side contact layer 23. A composite film of, for example, palladium, platinum, and gold (Pd/Pt/Au) is used as the second electrode 80. For example, a thickness of the Pd film is 0.05 μm, a thickness of the Pt film is 0.05 μm, and a thickness of the Au film is 0.05 μm. However, it is possible to use a transparent electrode such as indium tin oxide (ITO) or the like or a highly reflective metal such as Ag or the like in addition to the composite film.

Thereafter, a portion of the stacked structural body 10s described above is subjected to dry etching, the n-side contact layer 12 is exposed, and the first electrode 70 is formed. A composite film of, for example, titanium, platinum, and gold (Ti/Pt/Au) is used as the first electrode 70. For example, a thickness of the Ti film is approximately 0.05 μm, a thickness of the Pt film is approximately 0.05 μm, and a thickness of the Au film is approximately 1.0 μm.

Thereby, the semiconductor light emitting device 110 illustrated in FIGS. 2 and 3 is produced.

Figure 4:
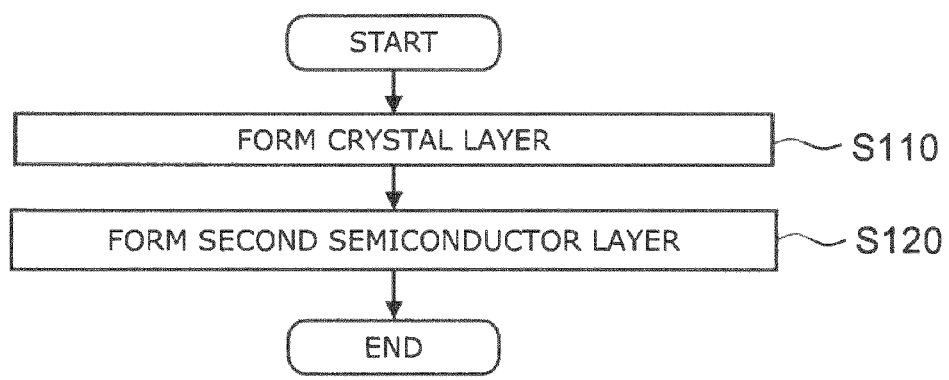
FIG. 4 is a flowchart illustrating a method for manufacturing a semiconductor light emitting device according to the embodiment.

FIG. 4 is a flowchart illustrating a method for manufacturing a semiconductor light emitting device according to the embodiment.

The method for manufacturing a semiconductor light emitting device according to the embodiment includes a method for manufacturing a semiconductor light emitting device including a crystal layer (the well layer 42 in the example of the semiconductor light emitting device 110) that includes a nitride semiconductor and contains In atoms and Ga atoms.

As illustrated in FIG. 4, this manufacturing method includes: forming the crystal layer by supplying a source gas including a first molecule including Ga atoms and a second molecule including In atoms onto a major surface of a base body (step S110). In the example of the semiconductor light emitting device 110 described above, the crystal layer including the nitride semiconductor and including In and Ga is the well layer 42. Additionally, the base body is the barrier layer 41 provided on the multilayered structural body 30. Additionally, a structural body having the barrier layers 41 and the well layer 42 already formed will become the base body. The first molecule and the second molecule will be described hereafter.

As illustrated in FIG. 4, this manufacturing method can further include: forming the second semiconductor layer 20 (i.e. the first p-side layer 21) on the active layer 40 (step S120). In other words, the method can include forming a crystal of a semiconductor layer (for example, the second semiconductor layer 20) on the crystal layer (for example, the well layer 42). It is noted that "forming a crystal of a semiconductor layer on the crystal layer" includes "forming a crystal of a semiconductor layer on the crystal layer wherein other layer (for example, the barrier layer) is interposed between the crystal layer and the crystal of the semiconductor layer" in addition to "forming a crystal of a semiconductor layer on the crystal layer wherein the crystal of the semiconductor layer is contact with the crystal layer" A temperature of the base body in the forming of the second semiconductor layer 20 is higher than a temperature of the base body in the forming of the well layer 42 crystal layer.

As already described, the temperature of the base body in the forming of the well layer 42 (surface temperature of the base body) is, for example, not less than 600° C. and not more than 800° C. On the other hand, the temperature of the base body in the forming, for example, of the first p-side layer 21 (i.e. the $Al_{0.2}Ga_{0.8}N$ layer) being to be the second semiconductor layer 20 is, for example, not less than 900° C. and not more than 1100° C.

Thus, in the manufacturing method according to the embodiment, the first p-side layer 21 is formed at the temperature higher than the formation temperature of the well layer 42 that includes the indium (In) at a high composition ratio.

It was found that when the first p-side layer 21 is formed at the temperature higher than the formation temperature of the well layer 42 that includes the indium (In) at a high composition ratio, generally, the structure of the well layer 42 changes and characteristics of the well layer 42 deteriorate.

Hereinafter, results of experiments performed by the inventors will be described. Hereinafter, a semiconductor light emitting device 120 will be described as the semiconductor light emitting device according to the embodiment. A structure of the semiconductor light emitting device 120 is the same as in the semiconductor light emitting device 110 described in relation to FIGS. 2 and 3 and therefore a description thereof is omitted. Hereinafter, a fabricating method for the semiconductor light emitting device 120 will be described in detail.

First, the substrate 5 made of sapphire was subjected to organic cleaning or acid cleaning. Then, the substrate 5 was introduced into a reaction chamber of an MOCVD apparatus and the buffer layer 6, made of GaN, was formed using trimethylgallium (TMGa) and ammonia ($NH_3$). A thickness of the buffer layer 6 was about 30 nm.

Next, in an atmosphere including nitrogen and hydrogen, the undoped n-side base layer 11 was formed at a temperature of 1120° C. using TMGa and ammonia. Then, the n-side contact layer 12 was formed using silane ($SiH_4$) as a impurity source gas. A thickness of the n-side base layer 11 was about 2 μm and a thickness of the n-side contact layer 12 was about 4 μm.

Next, in a nitrogen atmosphere, the first layer, made of undoped GaN, was formed at a temperature of 800° C. using TMGa and ammonia, having a thickness of 2 nm. Then, trimethylindium (TMIn) was further added and the second layer made of undoped $In_{0.07}Ga_{0.93}N$ was formed at 800° C., having a thickness of 1 nm. The forming of the first layer and the second layer was repeated 20 times and, finally, the multilayered structural body 30 was formed by forming the undoped GaN (the first layers) at the thickness of 2 nm.

Next, the temperature of the substrate 5 was set to 850° C. and, in a nitrogen atmosphere, the barrier layer 41 (the first barrier layer BL1), made of undoped GaN, was formed using TMGa and ammonia, having a thickness of 10 nm. Thereafter, the temperature of the substrate 5 was set to 730° C. and the well layer 42 (the first well layer WL1) made of undoped $In_{0.3}Ga_{0.7}N$ was formed using TMGa, TMIn, and ammonia, having a thickness of 2.5 nm. At that time, a mole supply ratio of the TMIn to a total of the TMGa and the TMIn was 0.85.

Thereafter, the temperature of the substrate 5 was set to 850° C. and the barrier layer 41 (a second barrier layer BL2), made of undoped GaN, was formed using TMGa and ammonia, having a thickness of 10 nm. Furthermore, the well layer 42 was formed thereon under the same conditions described above. The forming of the barrier layer 41 and the forming of the well layer 42 in this way were repeated, and the active layer 40 was formed.

A number of the well layers 42 was four, and the well layers 42 (the first well layer WL1 to a fourth well layer WL4) were undoped $In_{0.3}Ga_{0.7}N$ layers. A thickness of the well layers 42 (the first well layer WL1 to the fourth well layer WL4) was 2.5 nm. The barrier layers 41 (the first barrier layer BL1 to a fifth barrier layer BL5) were undoped GaN layers. A thickness of the barrier layers 41 (the first barrier layer BL1 to the fifth barrier layer BL5) was 10 nm.

Next, in an atmosphere including nitrogen and hydrogen, the first p-side layer 21 was formed at 1030° C. using trimethyl aluminum (TMAl), TMGa, and ammonia, along with biscyclopentadienyl magnesium ($Cp_2Mg$) as an impurity source. Furthermore, the second p-side layer 22 was formed using TMGa and ammonia, and then the p-side contact layer 23 was formed. A thickness of the first p-side layer 21 was 10 nm, a thickness of the second p-side layer 22 was 80 nm, and a thickness of the p-side contact layer 23 was 10 nm.

Following the forming of the crystals described above, the temperature was lowered to a room temperature, and the stacked structural body 10s was subjected to dry etching from the first major surface side of the p-side contact layer 23 to a thickness partway through the n-side contact layer 12. Then, the first electrode 70, made of the Ti/Pt/Au stacked film, was formed on the exposed n-side contact layer 12. Additionally, the second electrode 80, made of ITO, was formed on the p-side contact layer 23.

Furthermore, semiconductor light emitting devices of reference examples were formed as described hereinafter.

In a semiconductor light emitting device 191 of a first reference example, when forming the well layer 42, a mole supply ratio of the TMIn to the total of the TMGa and the TMIn was 0.7. Here, because the In composition ratio of the well layer 42 was made the same as in the semiconductor light emitting device 120, an amount of the TMGa supplied was doubled with respect to the semiconductor light emitting device 120. Aside from this, the semiconductor light emitting device 191 was fabricated in the same manner as the semiconductor light emitting device 120.

In a semiconductor light emitting device 192 of a second reference example, when forming the well layer 42, a mole supply ratio of the TMIn to the total of the TMGa and the TMIn was 0.6. Here, because the In composition ratio in the well layers 42 was made the same as in the semiconductor light emitting device 120, an amount of the TMGa supplied was quadrupled with respect to the semiconductor light emitting device 120. Aside from this, the semiconductor light emitting device 192 was fabricated in the same manner as the semiconductor light emitting device 120.

X-ray diffraction measurement was used to measure the In composition ratios xs of the well layers 42 of the semiconductor light emitting devices 120, 191, and 192. The In composition ratios xs of the well layers 42 of each of the semiconductor light emitting device 120, 191, and 192 were each found to be about 0.23.

Figure 5:
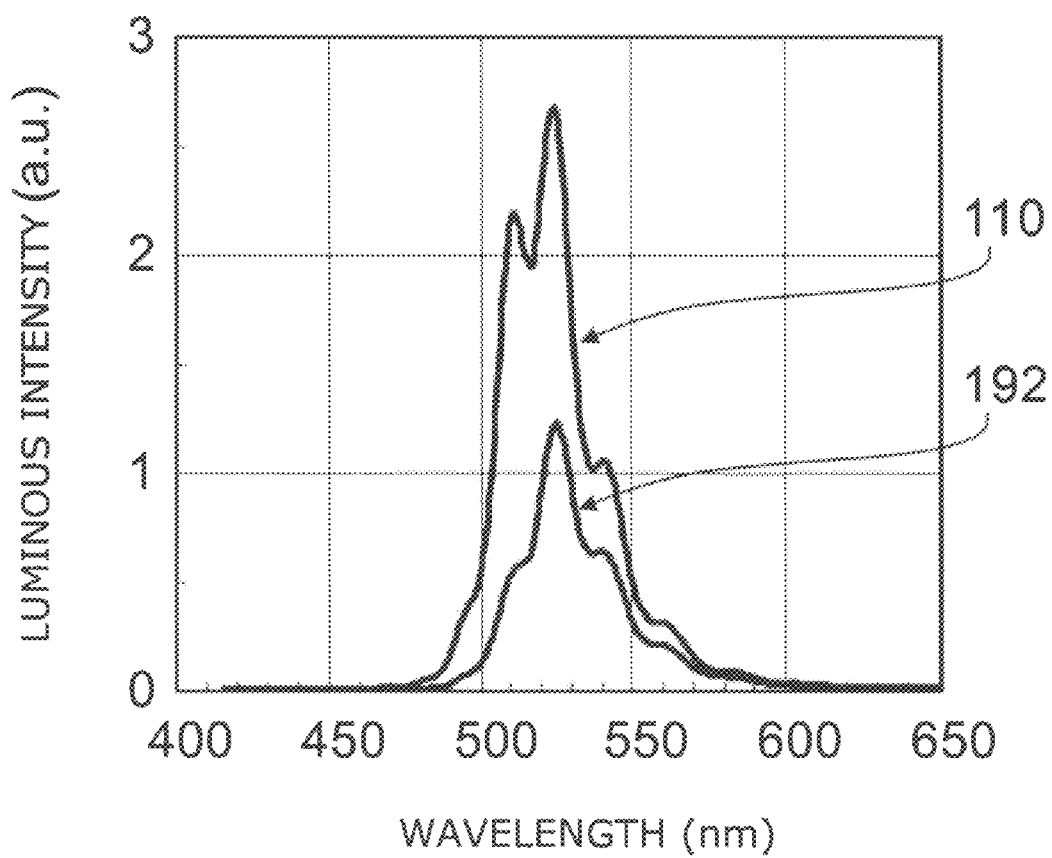
FIG. 5 is a graph illustrating the characteristics of a semiconductor light emitting device.

FIG. 5 is a graph illustrating the characteristics of a semiconductor light emitting device.

Specifically, this graph illustrates the optical characteristics of the semiconductor light emitting devices 120 and 192.

The horizontal axis shows wavelength (nm) and the vertical axis shows PL luminous intensity (arbitrary unit).

As illustrated in FIG. 5, in the semiconductor light emitting device 192 of the second reference example, a maximum value of the PL luminous intensity was about 1.2. On the other hand, in the semiconductor light emitting device 120 according to the embodiment, the PL luminous intensity was 2.6.

Additionally, while not illustrated in the drawings, a luminous intensity of the semiconductor light emitting device 191 of the first reference example was higher than that of the semiconductor light emitting device 192 and lower than that of the semiconductor light emitting device 120.

As illustrated in FIG. 5, PL peak wavelengths of the semiconductor light emitting device 120 and the semiconductor light emitting device 192 were about 530 nm, and showed green luminescence. While not illustrated in the drawings, a peak luminous wavelength of the semiconductor light emitting device 191 of the first reference example was also about 530 nm, and showed green luminescence.

Thus, in the semiconductor light emitting device 120 according to the embodiment, double the luminous intensity of the semiconductor light emitting device 192 of the second reference example can be obtained.

When the semiconductor light emitting devices 191 and 192 having low luminous intensity were compared to the semiconductor light emitting device 120 having high luminous intensity and analyzed, it was discovered that differences existed in the structures of the well layers 42 of these semiconductor light emitting devices.

FIGS. 6A to 6D are fluorescence microscopy photographs illustrating the characteristics of a semiconductor light emitting device.

These photographs are images of the well layer 42, observed using a fluorescence microscope. FIGS. 6A to 6D correspond to the semiconductor light emitting devices 120, 191, 192, and a test material 193, respectively.

The test material 193 is a test material of the semiconductor light emitting device 192 of the second reference example that was not subjected to the process following the forming of the second semiconductor layer 20 (i.e., the first p-side layer 21 or the like) after the forming of the active layer 40 including the well layer 42 and the barrier layers 41. Specifically, the test material 193 is a test material in which the high temperature processing was not performed after the forming of the active layer 40.

In these photographs, portions where a density is low in the photographs (light portions) correspond to portions where a photoluminescence intensity of the semiconductor light emitting device is high, and portions where a density is high in the photographs (dark portions) correspond to portions where the photoluminescence intensity of the semiconductor light emitting device is low.

Figure 6A:
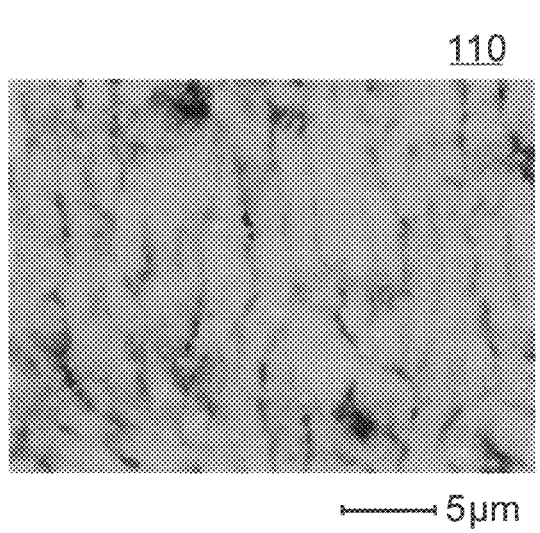
FIGS. 6A to 6D are fluorescence microscopy photographs illustrating the characteristics of a semiconductor light emitting device.
Figure 6B:
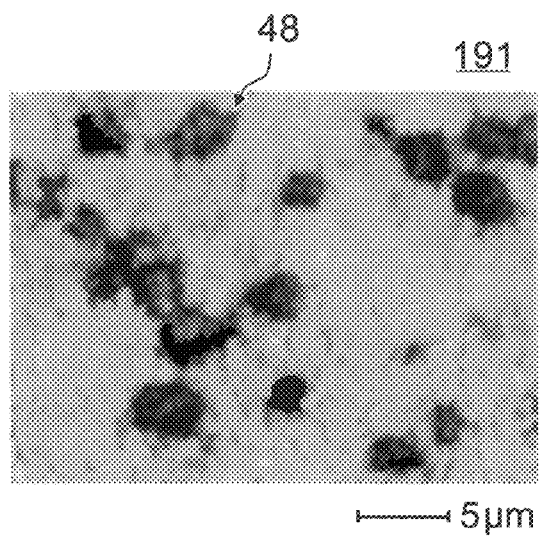

As illustrated in FIG. 6B, in the semiconductor light emitting device 191 of the first reference example having a low PL luminous intensity, dark spots 48 exist in the well layer 42.

Figure 6C:
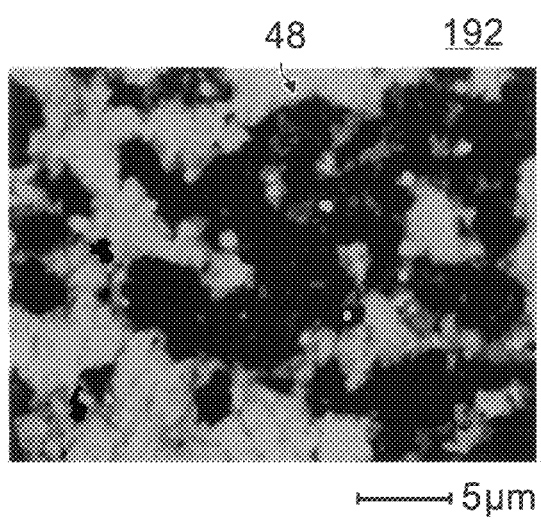

As illustrated in FIG. 6C, in the semiconductor light emitting device 192 of the second reference example having an even lower luminous intensity, a region of the dark spots 48 in the well layer 42 increased in comparison to the semiconductor light emitting device 191.

The dark spots 48 observed in FIGS. 6B and 6C correspond to portions having low photoluminescence intensity. In other words, the dark spots 48 correspond to regions where crystal quality of the active layer 40 degraded.

Figure 6D:
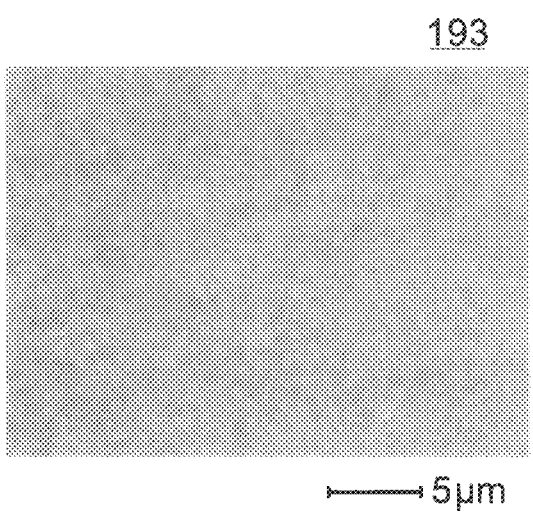

As illustrated in FIG. 6D, the dark spots 48 do not exist in the test material 193 that has a well layer 42 that was fabricated under the same conditions as the semiconductor light emitting device 192 of the second reference example, and that was not subjected to the high temperature processing of the second semiconductor layer 20.

From this, it is considered that the dark spots 48 generated in the semiconductor light emitting devices 191 and 192 were generated in the high temperature processing in the forming of the second semiconductor layer 20, after the forming of the active layer 40.

On the other hand, as illustrated in FIG. 6A, in the semiconductor light emitting device 120 according to the embodiment, the dark spots 48 were not generated in the well layer 42. Specifically, in the semiconductor light emitting device 120, the degradation of the well layer 42 is suppressed even when performing the high temperature processing on the active layer 40 when forming the second semiconductor layer 20.

Figure 7A:
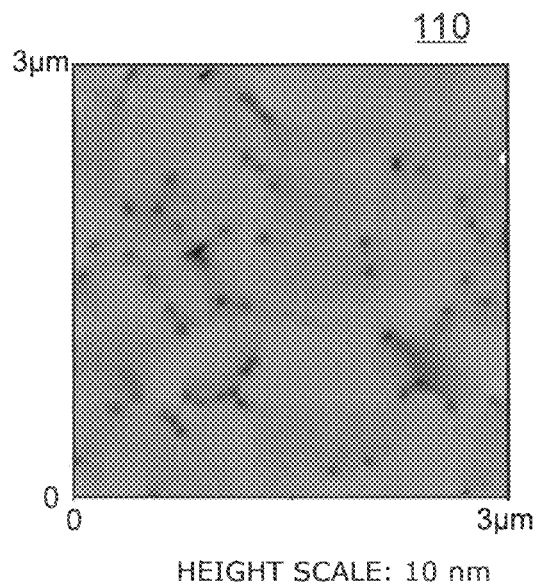
FIGS. 7A and 7B are atomic force microscopy photographs illustrating the characteristics of a semiconductor light emitting device.
Figure 7B:
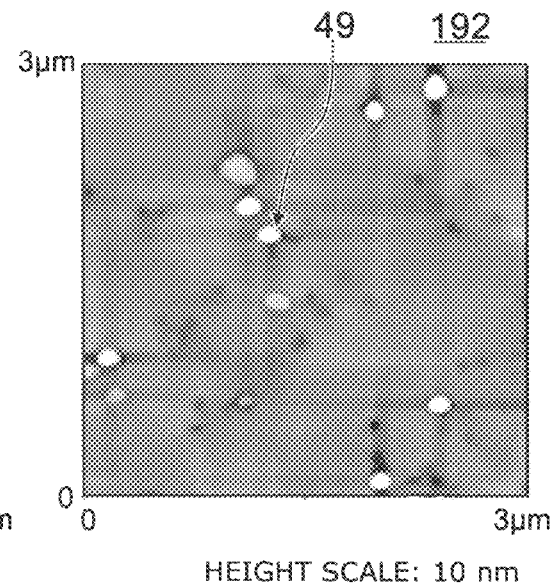

FIGS. 7A and 7B are atomic force microscopy photographs illustrating the properties of a semiconductor light emitting device.

FIGS. 7A and 7B show images of atomic force microscopy photographs of the well layer 42 of the semiconductor light emitting device 120 and the semiconductor light emitting device 192, respectively.

Additionally, in these photographs, the whiter portions represent portions of the surface that have higher heights, and the blacker portions represent portions of the surface that have lower heights.

As illustrated in FIG. 7B, in the semiconductor light emitting device 192 of the second reference example, bright spots 49 are observed. The bright spots 49 correspond to the dark spots 48 illustrated in FIG. 6C. Further investigation revealed that the bright spots 49 are In nanoclusters having high localized concentrations of 1n.

On the other hand, as illustrated in FIG. 7A, in the semiconductor light emitting device 120 according to the embodiment, the bright spots 49 are not observed. In other words, in the semiconductor light emitting device 120, generation of the In nanoclusters is suppressed.

As described above, in the semiconductor light emitting device 120 having a high PL luminous intensity, the dark spots 48 observed with the fluorescence microscope and the bright spots 49 observed with the atomic force microscope were not generated. On the other hand, in the semiconductor light emitting devices 191 and 192 having low PL luminous intensities, the dark spots 48 and the bright spots 49 were generated, and it was discovered that the density of the dark spots 48 correlated with the density of the bright spots 49. Based on the In nanoclusters (the bright spots 49) formed in the surface of the well layer 42, it is considered that the high temperature processing after the forming of the well layer 42 caused the dark spots 48 to be formed. From this, it is considered that a high PL luminous intensity can be obtained by suppressing the generation of the In nanoclusters (the bright spots 49).

Thus, in a well layer 42 having a high In composition ratio corresponding to a long wavelength (i.e. green), the structure of the active layer 40 including the well layer 42 breaks down due to the high temperature processing for the forming of the second semiconductor layer 20 after the forming of the well layer 42, thus leading to the generation of the dark spots 48 as described above. It is considered that the generation of the In nanoclusters is caused by localizing and agglomerating of the indium (In) incorporated in the well layers 42.

In the semiconductor light emitting devices 120, 191, and 192, the In composition ratios xs of the well layers 42 after forming are equivalent at about 0.23. In contrast, there are large differences in degree of generation of the dark spots 48 after the high temperature processing. In other words, there are large differences in the thermal stability of the well layers 42.

From this, it is considered that conditions related to the incorporation of the indium (In) in the well layer 42 in the forming of the well layer 42 affects the thermal stability of the well layer 42.

The inventors fabricated well layers 42 using different manufacturing conditions and, after forming the second semiconductor layer 20 thereon at a high temperature, evaluated the state of the dark spots 48 in the well layers 42.

As a result, a new parameter regarding the incorporatability of the indium (In) into the well layer 42 was employed and a correlation between this parameter and the degree of generation of the dark spots 48 was identified. This parameter is described hereinafter.

In a nitride semiconductor included in a well layer 42 (crystal layer) of a semiconductor light emitting device, an In composition ratio $xs$ is defined as a ratio of a number of In atoms to a total of the number of the In atoms and a number of Ga atoms. That is, the In composition ratio $xs$ is a composition ratio of the indium (In) included in a well layer 42 that is fabricated by vapor-phase deposition (the In composition ratio in a solid phase).

A first molecule including Ga (i.e. TMGa or the like) is used in the forming of the well layer 42. A first partial pressure P1 is defined as a partial pressure of a Ga source molecule including Ga atoms and a degradation species of the Ga source molecule included in the first molecule on a source gas including the first molecule and a second molecule including In atoms. The first partial pressure P1 is proportional to an amount of the Ga source molecule supplied (amount supplied per unit time) into a reaction chamber where crystal formation is performed.

A second molecule including In atoms (i.e. TMIn or the like) is used in the forming of the well layer 42. A second partial pressure P2 is defined as a partial pressure of an In source molecule including In atoms and a degradation species of the In source molecule included in the second molecule on a source gas. The second partial pressure P2 is proportional to an amount of the In source molecule supplied (amount supplied per unit time) into a reaction chamber where crystal formation is performed.

A vapor phase supply ratio $xv$ is defined as a ratio of the second partial pressure P2 to a total of the first partial pressure P1 and the second partial pressure P2. In other words, $xv=P2/(P1+P2)$.

The first partial pressure P1 corresponds to, for example, the number of Ga atoms in the first molecule supplied per unit time. The second partial pressure P2 corresponds to, for example, the number of In atoms in the second molecule supplied per unit time. For molecules including, for example, two atoms, partial pressure is calculated doubled. Thus, the vapor phase supply ratio $xv$ of the indium (In) is a ratio of the number of In atoms in the second molecule supplied per unit time to a total of the number of Ga atoms in the first molecule supplied per unit time and the number of In atoms in the second molecule supplied per unit time.

When $q$ is defined as a proportion of Ga incorporated in a crystal from the first molecule in the forming of the well layer 42 (ratio of the number of Ga atoms incorporated in the crystal to the number of Ga atoms injected from the vapor phase into the base body), and $r$ is defined as a proportion of In incorporated in a crystal from the second molecule in the forming of the well layer 42 (ratio of the number of In atoms incorporated in the crystal to the number of In atoms injected from the vapor phase into the base body), $xs=rP2/(qP1+rP2)$.

Here, when $r/q$ is defined as a ratio $k$ of a coefficient of In incorporated in the crystal from the second molecule to a coefficient of Ga incorporated in the crystal from the first molecule in the forming of the well layer 42, $xs=kP2/(P1+kP2)$, and when considered with $xv=P2/(P1+P2)$, $k$ is expressed as $(1-1/xv)/(1-1/xs)$. Here when the coefficient of Ga is 1, $k$ will be equivalent with a coefficient $r$ of the In incorporated in the crystal of the second molecule.

For example, in the semiconductor light emitting device 120 according to the embodiment, because the mole supply ratio of the TMIn to the total of the TMGa and the TMIn is 0.85, the vapor phase supply ratio $xv$ of the indium (In) is 0.85. The In composition ratio $xs$ in the composition ratio of In in the solid phase is, as previously described, 0.23. Therefore, in the semiconductor light emitting device 120, the coefficient $k$ of the indium (In) becomes 0.05.

In the semiconductor light emitting device 191 of the first reference example, because the mole supply ratio of the TMIn to the total of the TMGa and the TMIn is 0.7, the vapor phase supply ratio $xv$ of the indium (In) is 0.7. The In composition ratio $xs$ is 0.23. Therefore, in the semiconductor light emitting device 191, the coefficient $k$ of the indium (In) becomes 0.13.

In the semiconductor light emitting device 192 of the second reference example, because the mole supply ratio of the TMIn to the total of the TMGa and the TMIn is 0.6, the vapor phase supply ratio $xv$ of the indium (In) is 0.6. The In composition ratio $xs$ is 0.23. Therefore, in the semiconductor light emitting device 192, the coefficient $k$ of the indium (In) becomes 0.20.

The degree of generation of the dark spots 48 in the well layers 42 of various semiconductor light emitting devices fabricated while changing manufacturing conditions was evaluated. By investigating these results organizing by using the coefficient $k$ of the indium (In), a correlation between the coefficient $k$ of the indium (In) and the degree of generation of the dark spots 48 was found.

FIG. 1 is a graph illustrating the results of this evaluation. The horizontal axis of this graph shows the coefficient $k$ of the indium (In). The vertical axis shows a proportion Rd of an area of a region of the dark spots 48 per unit area of the well layer 42. In FIG. 1, the evaluated values of the semiconductor light emitting devices 191 and 192 of the first and second reference samples in addition to that of the semiconductor light emitting devices 120 according to the embodiment are indicated.

As illustrated in FIG. 1, in the semiconductor light emitting device 192 having a coefficient $k$ of the indium (In) of 0.2, the proportion Rd of the area of the dark spots 48 is extremely large at 0.6. In the semiconductor light emitting device 191 having a coefficient $k$ of the indium (In) of 0.13, the proportion Rd of the area of the dark spots 48 is rather large at 0.15.

On the other hand, in the semiconductor light emitting device 120 having a coefficient $k$ of the indium (In) of 0.05, the proportion Rd of the area of the dark spots 48 is substantially 0.

Furthermore, as illustrated in FIG. 1, also when the coefficient $k$ of the indium (In) was 0.06 and 0.08, the proportion Rd of the area of the dark spots 48 was substantially 0.

As is clear from FIG. 1, the proportion Rd of the area of the dark spots 48 increases rapidly when the coefficient $k$ of the indium (In) is greater than or equal to 0.1. From this, in order to suppress the generation of the dark spots 48, the coefficient $k$ of the indium (In) is preferably less than 0.1.

Furthermore, the coefficient $k$ of the indium (In) is more preferably less than or equal to 0.08, because then the proportion Rd of the area of the dark spots 48 will be substantially 0.

A small coefficient k of the indium (In) corresponds to a smaller amount of the indium (In) being incorporated into the well layers 42 from the source gas than an amount of the Ga being incorporated into the well layers 42 from the source gas. In other words, a small coefficient k corresponds to a desorption reaction of the indium (In) in the forming of the well layers 42 being accelerated more than when the coefficient k of the indium (In) is large.

It is considered that when the coefficient k of the indium (In) is large, the concentration of the indium (In) in the well layers 42 increases locally and, for example, the In agglomerates easily. When there are locations where the In concentration is locally high in the forming of the well layer 42, the agglomerated In is thermally decomposed, the structure of the active layer breaks down (deteriorates), and the dark spots 48 are formed as a result of the subsequent high temperature processing.

On the other hand, when the coefficient k of the indium (In) is set to be low, the desorption reaction of In atoms when forming the well layers 42 is accelerated. It is considered that because of this, the localized increasing of In concentration (i.e. agglomeration of the In atoms) in the well layers 42 can be suppressed. Therefore, the composition ratio of the indium (In) in the well layers 42 becomes uniform, and the generation of portions having high localized In concentrations can be suppressed. Thereby, it is considered that the generation of the dark spots 48 will be suppressed even in the subsequent high temperature processing. Specifically, by setting the coefficient k of the indium (In) to smaller than 0.1, the thermal stability of the well layers 42 can be improved.

Thus, the coefficient k of the indium (In) was introduced as a new parameter related to manufacturing conditions and a coefficient k of the indium (In) that led to an improvement in the thermal stability of the well layers 42 was quantitatively sought.

Generally, when forming an InGaN layer that emits light in the green region, in order to accelerate the incorporation of In into the InGaN layer, the formation temperature is lowered or the formation rate is increased. However, it is considered that such conditions will lead to an increase of an attachment coefficient of the In atoms on a surface of the InGaN crystal when fabricating an InGaN layer. Furthermore, under such conditions, surface migration of the Ga atoms will be easily degraded. As a result, it is considered that under such conditions, agglomeration of the In atoms will occur easily and that uniformity of the In composition ratio in the InGaN layer will be easily lost.

If the barrier layers 41 are formed on such InGaN layer well layers 42, the formation of the barrier layers 41 will be inhibited at regions of high In concentration, pits will be easily formed, and a flatness of the barrier layers 41 will be easily deteriorated. Specifically, a distribution of the film thickness of the barrier layers 41 will occur. As a result, quantum effect will not be sufficient. Furthermore, when forming the barrier layers 41, the well layers 42 may partially degrade or disappear. Additionally, it is considered that in the process of stacking the well layers 42 and the barrier layers 41, regions of high In concentration (i.e. agglomerations of In) will be generated in the pits, and when the second semiconductor layer 20 is formed at a high temperature following the forming of the active layer 40, degradation of the active layer 40 will occur starting in the regions of high In concentration, dark spots will form, and luminous efficiency will be decreased.

On the other hand, by setting the coefficient k of the indium (In) to be smaller than 0.1, a desorption reaction of the In atoms when forming the InGaN layers (well layers 42) is accelerated, and agglomeration of In in the InGaN layers can be suppressed. Thereby, it is possible to form InGaN layers wherein non-uniformity of the In composition ratio is suppressed. As a result, the forming of pits in the InGaN layers and regions of high In concentration (i.e. agglomerations of In) can be suppressed, and the deterioration of the active layer 40 when forming the second semiconductor layer 20 at a high temperature can be suppressed. Moreover, high-quality well layers 42 can be obtained. Thereby, a distribution of the luminous wavelength will be small, a high efficiency active layer 40 can be obtained, and a high efficiency semiconductor light emitting device can be obtained.

Thus, the method for manufacturing a semiconductor light emitting device according to the embodiment is applied to a semiconductor light emitting device including a crystal layer (well layer 42) that includes a nitride semiconductor wherein a ratio xs of a number of the In atoms to a total of a number of the In atoms and the number of the Ga atoms is not less than 0.2 and not more than 0.4.

This manufacturing method includes forming a crystal layer (the well layer 42 in the example of the semiconductor light emitting device 110) that includes a nitride semiconductor and contains In and Ga by supplying a source gas including a first molecule including Ga atoms and a second molecule including In atoms onto a major surface of a base body.

A vapor phase supply ratio xv of In is defined as a ratio of a second partial pressure P2 on a total of a first partial pressure P1 of a Ga source molecule including Ga atoms and a degradation species of the Ga source molecule included in the first molecule on a source gas and second partial pressure P2 of an In source molecule including In atoms and a degradation species of the In source molecule included in the second molecule on a source gas.

Specifically, for example, the vapor phase supply ratio xv of the indium (In) is defined as a ratio of the number of the In atoms in a second gas supplied per unit time to a total of the number of the Ga atoms in a first gas (gas including the first molecule) supplied per unit time and the number of the In atoms in the second gas (gas including the second molecule) supplied per unit time.

Here, a coefficient k of the indium (In) incorporated into the crystal layer (i.e. the well layer 42) from the second molecule in the forming of the crystal layer (i.e. the well layer 42) is $(1-1/xv)/(1-1/xs)$. In this manufacturing method, the coefficient k of the indium (In) described above is set to less than 0.1.

As previously described, an In composition ratio xs is measured using an analytical technique such as X-ray diffraction measurement or the like. Additionally, the vapor phase supply ratio xv of the indium (In) is calculated from a supply ratio of the first molecule (molecule including Ga atoms) and the second molecule (molecule including In atoms) supplied in the formation of the well layers 42. For example, the vapor phase supply ratio xv of the indium (In) is calculated from the first partial pressure P1 of a source molecule including Ga atoms and a degradation species thereof in a vapor phase of the first molecule and the second partial pressure P2 of a source molecule including In atoms and a degradation species thereof in a vapor phase of the second molecule.

For example, the coefficient k of the indium (In) is set to less than 0.1 by suppressing at least one of an amount (partial pressure) of the second molecule (the molecule including In atoms) supplied, an amount (partial pressure) of the first molecule (the molecule including Ga atoms) supplied, an amount (partial pressure) of a molecule (i.e. ammonia gas) including a group V element (nitrogen atom) supplied, and a temperature of the base body.

Figure 8:
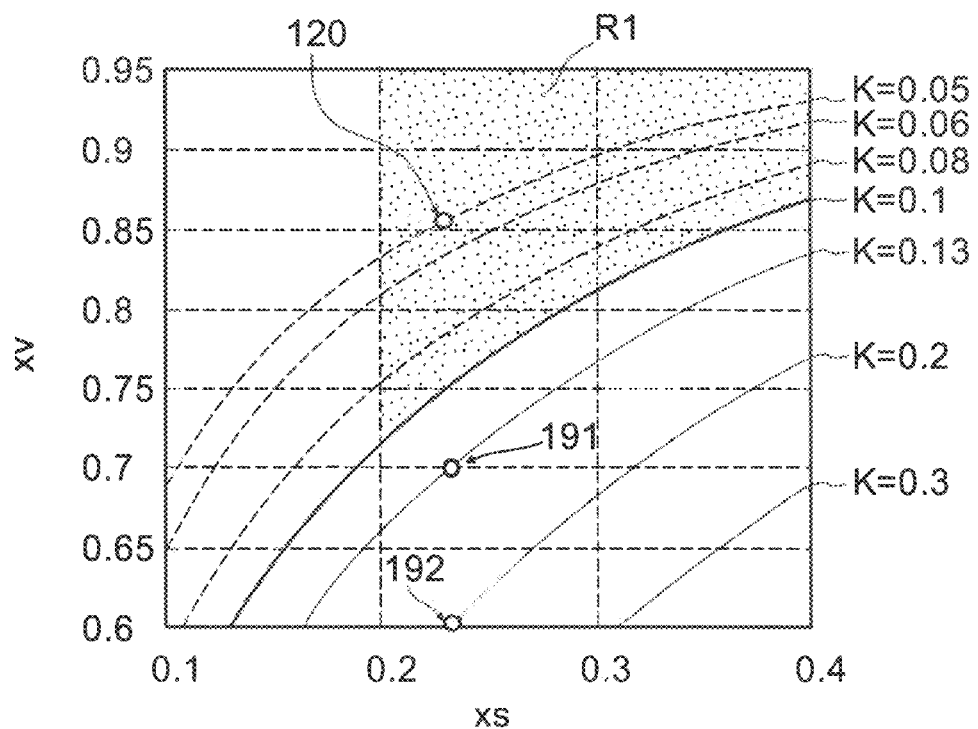
FIG. 8 is a schematic view illustrating the conditions of the method for manufacturing a semiconductor light emitting device according to the embodiment.

FIG. 8 is a schematic view illustrating the conditions of the method for manufacturing a semiconductor light emitting device according to the embodiment.

The horizontal axis in this drawing represents the In composition ratio xs (the In composition ratio in a solid phase) of the well layers 42 and the vertical axis represents the vapor phase supply ratio xv of the indium (In).

In this drawing, the coefficient k of the indium (In) is shown as a curved line.

As illustrated in FIG. 8, in the manufacturing method according to the embodiment, a condition region R1 indicated by hatching is employed. Specifically, in the condition region R1, the In composition ratio xs is not less than 0.2 and not more than 0.4 and the coefficient k if the indium (In) is less than 0.1.

Thereby, a semiconductor light emitting device can be manufactured that has superior thermal stability and an active layer in which degradation is suppressed in high temperature processing after crystal formation. In other words, a semiconductor light emitting device can be manufactured wherein degradation of the active layer is suppressed.

In cases where the In composition ratio xs is less than 0.2, such as in well layers 42 that emit blue light having an In composition ratio xs of 0.15, the generation of the dark spots 48 described above substantially does not pose a problem. Specifically, when the In composition ratio xs is less than 0.2, a concentration of the In incorporated into the crystal in the forming of the well layers 42 is low. Therefore, because agglomeration of the In atoms and formation of In nanoclusters substantially does not occur, the formation of the dark spots 48 due to the subsequent high temperature processing (the forming of the second semiconductor layer 20) substantially does not occur. Therefore, it was not necessary to consider the newly introduced coefficient k of the indium (In) for the forming of well layers 42 that emit blue or violet light.

On the other hand, in cases where the In composition ratio xs is more than 0.2, such as in well layers 42 that emit green light, a concentration of the In incorporated into the crystal in the forming of the well layers 42 is high. Therefore, the dark spots 48 are formed easily as a result of the subsequent high temperature processing (the forming of the second semiconductor layer 20). Therefore, when the In composition ratio xs is greater than or equal to 0.2, well layers having superior thermal stability and wherein the generation of the dark spots 48 is suppressed can be formed by forming the well layers 42 under the condition of suppressing the newly introduced coefficient k of the indium (In) to less than 0.1.

In this manufacturing method, the temperature (surface temperature) of the base body in the forming of the well layers 42 is preferably set to not less than 600° C. and not more than 750° C. If the temperature is less than 600° C., the coefficient k of the indium (In) will easily increase and the crystal quality of the well layers 42 will decrease. If the temperature exceeds 750° C., the crystal quality of the well layers 42 will be easily degraded due to an increase in incorporated impurities and a formation of defects.

This manufacturing method may, following the forming of the active layer 40, further include forming a crystal of a semiconductor layer (i.e. the second semiconductor layer 20) on the crystal layer (i.e. the well layers 42) at a temperature higher than the temperature of the base body in the forming of the crystal layer (i.e. the well layers 42). Thus, by setting the coefficient k of the indium (In) to less than 0.1, degradation of the well layers 42 caused by the forming of the second semiconductor layer 20 can be suppressed even though the second semiconductor layer 20 is formed at a higher temperature than the formation temperature of the well layers 42.

This manufacturing method may further include forming the barrier layers 41, implemented either before or after the forming of the well layers 42. In these barrier layers 41, the ratio of the indium (In) among group III elements is lower than the In composition ratio xs in the well layers 42. In other words, in the semiconductor light emitting device manufactured by this manufacturing method, the active layer 40 may have a quantum well structure where the well layers 42 are provided between a plurality of the barrier layers 41. Thereby, luminous efficiency is improved.

The temperature of the base body in the forming of the barrier layers 41 is preferably set higher than the temperature of the base body in the forming of the well layers 42. Thereby, crystal defects of the active layer 40 can be reduced.

In this manufacturing method, the forming of the well layers 42 and the forming of the barrier layers 41 are preferably alternately repeated 3 times or more. When the number of stacked layers of the well layers 42 is 3 or more, the effect of reducing strain energy applied to the well layers 42 becomes large. Thereby, luminous efficiency is further improved.

In the experiments of the inventors, sapphire was used for the substrate 5, but materials such as GaN, SiC, Si, GaAs, and the like may be used for the substrate 5. A substrate having a major surface of a C surface may be used for the substrate 5. Additionally, a substrate having a surface inclined from the C surface may be used. Particularly, when a substrate having a major surface of a C surface is used for the substrate 5, an effect of high crystal quality being maintained even after the high temperature processing of the forming of the second semiconductor layer 20 will be effectively exerted.

The manufacturing method of nitride semiconductors according to the embodiment can be applied to from blue to green, from green to red laser diodes (LD), and the like as well as to from blue/green to green and from green to red LEDs.

The semiconductor light emitting device according to the embodiment can be applied to LEDs. The LEDs as described above can be applied to display devices, lighting devices, and the like. Additionally, the semiconductor light emitting device according to the embodiment can be applied to, for example, laser diodes (LD) and the like that are used as light sources for reading and writing in high density storage disks.

According to the embodiment, a method for manufacturing a semiconductor light emitting device wherein degradation of an active layer is suppressed can be provided.

Note that in this specification, the term, "nitride semiconductor" includes semiconductors of all compositions wherein composition ratios of x, y, and z in the formula $B_xIn_yAl_zGa_{1-x-y-z}N$ fall within the respective ranges of $0 \leq x \leq 1$, $0 \leq y \leq 1$, $0 \leq z \leq 1$, and $x+y+z \leq 1$. Furthermore, with the formula described above, "nitride semiconductors" shall also be understood to include semiconductors further including class V elements other than N (nitrogen), semiconductors further including various elements added to control various physical properties such as conductivity type and the like, and semiconductors further including various elements that are included unintentionally.

In this specification, "perpendicular" and "parallel" are not used to mean perpendicular and parallel in their narrowest sense, but rather substantially perpendicular or parallel so as to take factors into account such as variations in manufacturing processes and the like.

An embodiment of the invention with reference to examples was described above. However, the invention is not limited to these examples. The scope of the invention includes all cases in which, for example, a person skilled in the art could make use of publicly known information to appropriately select configuration elements such as the substrate, buffer layers, semiconductor layers, active layers, barrier layers, well layers, stacked structural body, electrodes, and the like included in the semiconductor light emitting device provided that the obtained effects are similar. For example, the compositions, film thicknesses, and the like described in the embodiments described above are examples and various selections are possible.

Additionally, combinations of elements from two or more of the examples are also included in the scope of the invention, provided they are technically possible and do not depart from the spirit of the invention.

Beside such cases, all semiconductor light emitting devices based on the embodiments of the invention described above that are obtainable through appropriate design modifications by a person skilled in the art shall be understood to fall within the scope of the invention, provided such semiconductor light emitting devices do not depart from the spirit of the invention.

Furthermore, regarding the scope of the spirit of the invention, it is understood that a variety of variations and modifications could be conceived by a person skilled in the art and that these variations and modifications all fall within the scope of the invention as well.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for manufacturing a semiconductor light emitting device including a crystal layer including a nitride semiconductor, the crystal layer containing In atoms and Ga atoms, the method comprising:
    forming the crystal layer by supplying a source gas including a first molecule including Ga atoms and a second molecule including In atoms onto a major surface of a base body,
    the crystal layer having a ratio xs of a number of the In atoms to a total of the number of the In atoms and a number of the Ga atoms being not less than 0.2 and not more than 0.4,
    a vapor phase supply ratio xv of In being a ratio of a second partial pressure to a total of a first partial pressure and the second partial pressure, the first partial pressure being a pressure of the first molecule and a degradation species of the first molecule on the source gas, the second partial pressure being a pressure of the second molecule and a degradation species of the second source molecule on the source gas, $(1-1/xv)/(1-1/xs)$ being less than 0.1.

2. The method according to claim 1, wherein a temperature of the base body in the forming the crystal layer is not less than 600° C. and not more than 750° C.

3. The method according to claim 1, further comprising:
    forming a crystal of a semiconductor layer on the crystal layer at a temperature higher than a temperature of the base body in the forming the crystal layer.

4. The method according to claim 3, wherein a temperature in the forming the crystal of the semiconductor layer is not less than 900° C. and not more than 1100° C.

5. The method according to claim 1, further comprising:
    forming a barrier layer having a lower In composition ratio among group III elements than the In composition ratio in the crystal layer, the forming the barrier layer being performed before the forming the crystal layer or after the forming the crystal layer.

6. The method according to claim 5, wherein a temperature of the base body in the forming the barrier layer is not less than a temperature of the base body in the forming the crystal layer.

7. The method according to claim 5, wherein the forming the crystal layer and the forming the barrier layer are alternately repeated three times or more.

8. The method according to claim 1, wherein the crystal layer is a well layer.

9. The method according to claim 8, wherein the base body includes a barrier layer.

10. The method according to claim 1, wherein the first molecule includes trimethylgallium and the second molecule includes trimethylindium.

11. A method for manufacturing a semiconductor light emitting device including a crystal layer including a nitride semiconductor, the crystal layer containing In atoms and Ga atoms, the method comprising:
    forming the crystal layer by supplying a source gas including a gas including a first molecule including Ga atoms and a gas including a second molecule including In atoms onto a major surface of a base body,
    the crystal layer having a ratio xs of a number of the In atoms to a total of the number of the In atoms and a number of the Ga atoms being not less than 0.2 and not more than 0.4,
    a vapor phase supply ratio xv of In being a ratio of a number of the In atoms in the gas including the second molecule supplied per unit time to a total of a number of Ga atoms in the gas including the first molecule supplied per unit time and the number of In atoms in the gas including the second molecule supplied per unit time, $(1-1/xv)/(1-1/xs)$ being less than 0.1.

12. The method according to claim 11, wherein a temperature of the base body in the forming the crystal layer is not less than 600° C. and not more than 750° C.

13. The method according to claim 11, further comprising:
    forming a crystal of a semiconductor layer on the crystal layer at a temperature higher than a temperature of the base body in the forming the crystal layer.

14. The method according to claim 13, wherein a temperature in the forming the crystal of the semiconductor layer is not less than 900° C. and not more than 1100° C.

15. The method according to claim 11, further comprising:
    forming a barrier layer having a lower In composition ratio among group III elements than the In composition ratio in the crystal layer, the forming the barrier layer being performed before the forming the crystal layer or after the forming the crystal layer.

16. The method according to claim 15, wherein a temperature of the base body in the forming the barrier layer is not less than a temperature of the base body in the forming the crystal layer.

17. The method according to claim 15, wherein the forming the crystal layer and the forming the barrier layer are alternately repeated three times or more.

18. The method according to claim 11, wherein the crystal layer is a well layer.

19. The method according to claim 18, wherein the base body includes a barrier layer.

20. The method according to claim 11, wherein the first molecule includes trimethylgallium and the second molecule includes trimethylindium.

* * * * *